(12) United States Patent
Appinger et al.

(10) Patent No.: US 6,983,407 B2
(45) Date of Patent: Jan. 3, 2006

(54) RANDOM PATTERN WEIGHT CONTROL BY PSEUDO RANDOM BIT PATTERN GENERATOR INITIALIZATION

(75) Inventors: Joerg Georg Appinger, Aidlingen (DE); Michael Juergen Kessler, Herrenberg (DE); Manfred Schmidt, Schoenaich (DE)

(73) Assignee: International Business Machines Corporation, Armonk, NY (US)

( * ) Notice: Subject to any disclaimer, the term of this patent is extended or adjusted under 35 U.S.C. 154(b) by 199 days.

(21) Appl. No.: 10/458,895

(22) Filed: Jun. 11, 2003

(65) Prior Publication Data

US 2003/0233607 A1 Dec. 18, 2003

(30) Foreign Application Priority Data

Jun. 14, 2002 (EP) .................................. 02013125

(51) Int. Cl.
*G01R 31/28* (2006.01)
*G06F 11/00* (2006.01)
(52) U.S. Cl. ..................................... 714/739; 714/728
(58) Field of Classification Search ................ 714/728, 714/738, 739
See application file for complete search history.

(56) References Cited

U.S. PATENT DOCUMENTS

| | | | |
|---|---|---|---|
| 4,503,537 A | 3/1985 | McAnney | 371/25 |
| 4,513,418 A | 4/1985 | Bardell, Jr. et al. | 371/25 |
| 4,905,241 A | 2/1990 | Schmid et al. | 371/22.5 |
| 5,297,151 A | 3/1994 | Gruetzner et al. | 371/27 |
| 5,394,405 A | 2/1995 | Savir | 371/27 |
| 5,983,380 A | 11/1999 | Motika et al. | 714/733 |

OTHER PUBLICATIONS

Martinez, M.; Bracho, S.; Weighted BIST structures in the arithmetic unit of a communication processor; IEE Proceedings-Computers and Digital Techniques, vol.: 142, Issue: 5, Sep. 1995, pp.: 360-366.*
Zhang, X.; Roy, K.; Design and synthesis of low power weighted random pattern generator considering peak power reduction; International Symposium on Defect and Fault Tolerance in VLSI Systems, Nov. 1-3, 1999, pp.: 148-156.*
Cellular Automata Digital Worlds, A. Schatten, pp. 1-18, http://www.ifs.tuwien.ac.at/~aschatt/info/ca/.
"Biased Random Pattern Test Generation", IBM Technical Disclosure Bulletin, pp. 411-412, Jul. 1990.

* cited by examiner

*Primary Examiner*—Joseph D. Torres
(74) *Attorney, Agent, or Firm*—William A. Kinnaman, Jr.; Floyd A. Gonzalez

(57) ABSTRACT

A plurality of pseudo random bit-pattern generators (PRPGs), advantageously linear feedback shift registers (LFSRs), having predetermined lengths and individual different tap locations for providing a respective sequence of pseudorandom bit-patterns. An output from a predetermined respective tap location at each LFSR is fed to a common OR-gate, a selected subset of the LFSRs are initialized with all bit storing locations to "0" in order to generate a respective permanent "0"-bit sequence, and the output of the OR-gate is used for reading the weighted or flat random bit output-pattern thereof. By controlling the number of zero-set LFSRs—a subset of the LFSRs—the weight of the generated output-pattern can be controlled.

11 Claims, 6 Drawing Sheets

```
                         LFSR-1      LFSR-2
OR-Output
                      A  B  C  D   E  F  G  H  I    O
                      -----------------------------
Initial Seed ==>      0  1  0  1   0  1  0  1  0    1
                      1  0  1  0   0  0  1  0  1    1
                      1  1  0  1   0  0  0  1  0    1
                      1  1  1  0   0  0  0  0  1    1
                      1  1  1  1   1  0  0  0  0    1
                      0  1  1  1   0  1  0  0  0    1
                      0  0  1  1   0  0  1  0  0    1
                      0  0  0  1   1  0  0  1  0    1
                      1  0  0  0   0  1  0  0  1    1
                      0  1  0  0   1  0  1  0  0    0
                      0  0  1  0   1  1  0  1  0    0
                      1  0  0  1   0  1  1  0  1    1
                      1  1  0  0   0  0  1  1  0    0
                      0  1  1  0   1  0  0  1  1    1
                      1  0  1  1   1  1  0  0  1    1
                      0  1  0  1   1  1  1  0  0    1
                      1  0  1  0   1  1  1  1  0    0
                      1  1  0  1   1  1  1  1  1    1
                      1  1  1  0   0  1  1  1  1    1
                      1  1  1  1   0  0  1  1  1    1
                      0  1  1  1   0  0  0  1  1    1
                      0  0  1  1   1  0  0  0  1    1
                      0  0  0  1   1  1  0  0  0    1
                      1  0  0  0   0  1  1  0  0    0
                      0  1  0  0   1  0  1  1  0    0
                      0  0  1  0   1  1  0  1  1    1
                      1  0  0  1   1  1  1  0  1    1
                      1  1  0  0   0  1  1  1  0    0
                      0  1  1  0   1  0  1  1  1    1
                      1  0  1  1   0  1  0  1  1    1
                      0  1  0  1   1  0  1  0  1    1
                      1  0  1  0   0  1  0  1  0    0
```

FIG. 4

```
                LFSR-1      LFSR-2      OR-Output
                A B C D     E F G H I   O
                ------------------------------
Initial Seed ==> 0 0 0 0    0 1 0 1 0   0
                 0 0 0 0    0 0 1 0 1   1
                 0 0 0 0    0 0 0 1 0   0
                 0 0 0 0    0 0 0 0 1   1
                 0 0 0 0    1 0 0 0 0   0
                 0 0 0 0    0 1 0 0 0   0
                 0 0 0 0    0 0 1 0 0   0
                 0 0 0 0    1 0 0 1 0   0
                 0 0 0 0    0 1 0 0 1   1
                 0 0 0 0    1 0 1 0 0   0
                 0 0 0 0    1 1 0 1 0   0
                 0 0 0 0    0 1 1 0 1   1
                 0 0 0 0    0 0 1 1 0   0
                 0 0 0 0    1 0 0 1 1   1
                 0 0 0 0    1 1 0 0 1   1
                 0 0 0 0    1 1 1 0 0   0
                 0 0 0 0    1 1 1 1 0   0
                 0 0 0 0    1 1 1 1 1   1
                 0 0 0 0    0 1 1 1 1   1
                 0 0 0 0    0 0 1 1 1   1
                 0 0 0 0    0 0 0 1 1   1
                 0 0 0 0    1 0 0 0 1   1
                 0 0 0 0    1 1 0 0 0   0
                 0 0 0 0    0 1 1 0 0   0
                 0 0 0 0    1 0 1 1 0   0
                 0 0 0 0    1 1 0 1 1   1
                 0 0 0 0    1 1 1 0 1   1
                 0 0 0 0    0 1 1 1 0   0
                 0 0 0 0    1 0 1 1 1   1
                 0 0 0 0    0 1 0 1 1   1
                 0 0 0 0    1 0 1 0 1   1
                 0 0 0 0    0 1 0 1 0   0
```

FIG. 5

RANDOM PATTERN WEIGHT CONTROL BY PSEUDO RANDOM BIT PATTERN GENERATOR INITIALIZATION

BACKGROUND OF THE INVENTION:

The present invention relates to the generation of random patterns in electronic circuits. In particular, it relates to a method and system for controlling the weight of a random bit pattern generated in an electronic circuit.

A technical area in which the present invention can be preferably applied is in integrated circuits, which are provided with logic circuits and self-test circuits for testing the logic circuits. Such built-in self-test technology is used in a wide spread plurality of technical devices, which have a more or less chip-controlled operation mode. Examples are chips in a motherboard of a computer, printers, and other electronic devices. The need for self-test technology is present due to the fact that complex very large-scale integrated circuit devices are fabricated on a single semiconductor chip and contain millions of functional circuit elements. For testing all these circuit elements, a very huge number of deterministic test patterns are necessary. Most of the circuit elements could be tested with Build-In-Self-Test (BIST) using weighted random test pattern. A small rest of complex patterns is then tested with deterministic test pattern.

If, by way of example, a semiconductor chip is provided with fifty input connections, the number of combinations of inputs is $2^{50}$. While one could apply that number of different input patterns, record the output responses, and compare those responses with the responses that ought to result, this would be an unacceptable work as it would last much too long and is thus impossible for a modern production testing.

U.S. Pat. No. 5,983,380 to IBM corporation discloses a built-in self-test design (BIST), a weighted random pattern (WRP), and deterministic pattern test methodologies which correspond to the current state of the art in support of level-sensitive scan device (LSSD) logic and structural testing, which is today the prevailing main design and test approach. This prior art approach utilizes a linear feedback shift register (LFSR) 12, see FIG. 1 and FIG. 6, which applies test vectors to an integrated circuit device under test which is in turn not explicitly depicted. The test vector includes bit locations of a predetermined length, which are filled with a weighted random bit pattern.

A control logic 14 comprising a plurality of AND-gates 15 the outputs of which are connected to the input of a common OR-gate 16 is fed with random bits coming from a predetermined plurality of tap locations from the LFSR 12, and with a predetermined plurality of control inputs the number of which defines the number of different possible weights for the generated random bit pattern.

A disadvantage of this prior art approach is that a lot of chip area is required for implementing the control circuit 14 and the additional wiring of the control lines. Further, the separate (not depicted) control circuit required for generating the control inputs for said circuit 14. Said control inputs are denoted with reference sign 17.

This disadvantage is the more intolerable the wider are decoders or multiplexers which must be tested with a wide sequence of "0" or "1" bit in parallel, as in such cases the control overhead is consuming an intolerable fraction of chip area.

BRIEF SUMMARY OF THE INVENTION

It is thus an objective of the present invention to provide a method and system, which consumes less chip area.

According to the broadest aspect of the present invention a method and system for controlling the weight of a random bit pattern generated in an electronic circuit is proposed, which is characterized as follows:

a) using a plurality of pseudorandom bit-pattern generators further referred to herein as "PRPG" of a respective predetermined length for providing a respective sequence of pseudorandom bit output-patterns, each PRPG having an output port for outputting a pseudorandom bit-pattern, b) feeding an output from said output port to a common logical OR-gate, c) initializing a selected subset of said plurality of PRPG by either an initial random-state, zero-state or weight-state in order to generate a respective pseudorandom bit-pattern, a zero-pattern or a weight-pattern, and d) using the output of said OR-gate for reading the weighted or flat pseudorandom output-pattern thereof, respectively.

The advantage is that the resulting weight factor of the output-pattern is controlled by the initial state of the plurality of PRPGs, and that no further control logic and control lines are needed, as it was mentioned above. Thus, a considerable amount of chip area is saved compared to prior art and easier control of the random weighting is provided. The inventive basic approach can be implemented in any scan designs, LSSD, boundary scan, stumps and Multiple Input Signature Register (MISR) architectures.

Thus, according to a particular aspect of the present invention, the inventive setting of the weight factor without any additional control logic in the above sense is done by "replacing" a "big" PRPG by a plurality of some smaller PRPGs. These smaller PRPGs are joint together with a logical OR-gate.

The plurality of PRPGs may be a combination of any type of PRPG. Examples for different types of PRPGs are Linear Feedback Shift Register (LFSR), Ring Shift Register (RSR), cellular automata (CA), or any further dedicated logic circuit.

The present invention may be implemented advantageously when using the special case of one or more LFSRs. LFSRs have the property that they can be initialized by either a random-state or zero-state. Herein the random-state, also known as SEED, means normal usage, namely initialization for pseudorandom pattern generation.

In contrast, an LFSR initialized with zero-state remains in this state and thus generates a zero-pattern. Herein zero-pattern means that no logical true value at the said OR-gate occurs. In other words, an LFSR initialized by the zero-state does not contribute to the output-pattern.

Thus LFSR initialization can be evaluated for weighting purposes. In this sense an example is given below with a sample LFSR of initial zero-state of value '0'.

By initialization none, one or more of the LFSRs can be set to zero-state can be used according to the present invention in order to control the weight of the pattern generation. For example, when the total of LFSRs is 6, and the selected subset of LFSRs being set to zero-state is preset to be 4, then a weight results of $2^{(6-4)}=2^2=4$. Instead, when only 1 of said 6 LFSRs is set to zero-state, then the weight is $2^{(6-1)}=2^5=32$.

When further, at least one of said LSFRs has a predetermined first larger length in order to provide for respective long-periodic sequence of pseudorandom numbers, then the remaining LFSRs can be selected to be small in length and can be selectively used to produce zero-patterns in the above sense.

When further, the number of bit latches comprised of each LFSR, or a subset of them corresponds to a prime number which have the quality of no common divisor, then the highest number of pseudorandom output-patterns, weighted or flat, could be generated for one period.

In another special implementation the plurality of the PRPGs may be a combination of LFSRs and ring shift registers (RSR). RSRs have the property, that the initial bit values, here called "initial weight-state", are not scrambled but shifted over the bit positions generating a weight-pattern. The initial weight-state can be defined in any distribution of the 0/1-values. Thus, it can be defined with regard to special characteristics of the device under test in order to enhance test efficiency.

When further, as lined out above at least one of said LSFRs has a predetermined first larger length, then the plurality of PRPGs generates a high total output-pattern count, whereby all patterns are weighted according to the initial weight-state. The remaining PRPGS, that may also be a mixture of RSRs and LFSRs, are preferably defined in a second smaller length. However, the remaining PRPGs can be selectively used in the above sense to produce weight-pattern or zero-patterns, respectively.

BRIEF DESCRIPTION OF THE SEVERAL VIEWS OF THE DRAWING

These and other objects will be apparent to one skilled in the art from the following detailed description of the invention taken in conjunction with the accompanying drawings in which:

FIG. 4 is a schematic representation of a truth table applying to FIG. 2, both LFSRs having an initial non-zero seed;

FIG. 5 is a schematic representation of a truth table applying to FIG. 2, whereby one LFSR is set to zero, initially;

Figure 1:
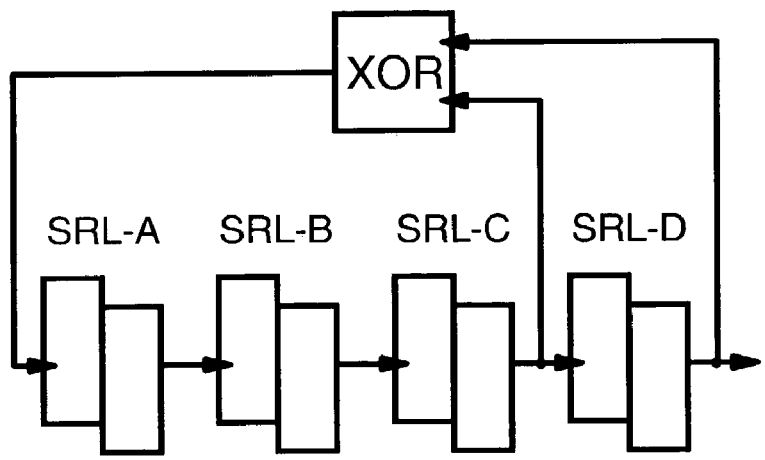
FIG. 1 is a schematic representation of a prior art Linear Feedback Shift Register (LFSR)

DETAILED DESCRIPTION OF THE INVENTION:

With general reference to the figures and with special reference now to FIG. 1, just for introductory purposes, a state of the art LFSR is shown. An exemplary number of 4 shift register latches, named SRL-A, to SRL-D are connected in series. The output of SRL-D and the output of SRL-C are connected to the input of an XOR-gate, the output of which is fed back to the input of the first shift register SRL-A. Applying an initial seed to all of the shift register latches, a pseudorandom bit sequence can be read out from either of the latches.

Figure 2:
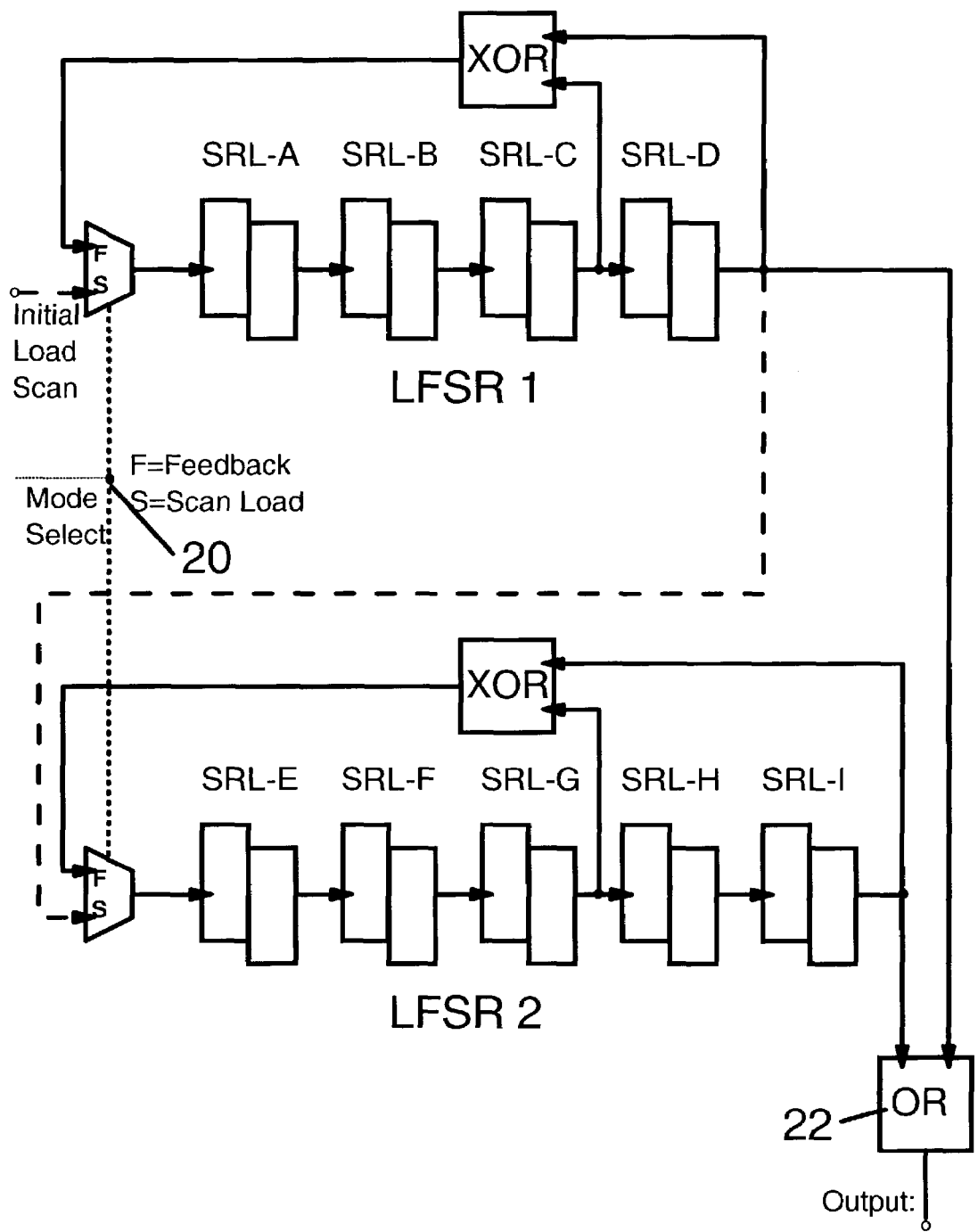
FIG. 2 is a schematic representation of a sample embodiment of a random weighted pattern generator comprising two LFSRs, according to the invention.

With reference to FIG. 2 the principle of the present invention shall be explained in more detail. FIG. 2 is expressible hold very simple in order to improve clarity and illustrate the principle of the present invention. It shows a block diagram of an example with two LFSRs, one depicted in the upper half of the figure and the other depicted in the bottom part of it. Each of them, LFSR1 and LFSR2 are constructed similar to the circuit as shown in FIG. 1.

According to the invention, there are two different modes of operation:

For entering the first mode, a Mode-Select-Switch 20 is switched to 'Initial Load Scan', to load both LFSRs with an initial seed. Both LFSRs are connected in series. With a plurality of nine shift cycles, both LFSRs 1 and 2 are filled with the initial data, i.e., the initial state.

For entering the operation mode (feedback mode) the Mode-Select-Switch 20 is switched to 'Feedback'. In this mode the weighted or flat random output-patterns are generated. This is the actual operation mode in which a device under test is fed with random data via the OR-gate 22 output. When one of the LFSRs has an initial seed of '0' (initial zero-state) only, then a weight can be obtained of ½ for the random bit output-pattern at the OR-gate 22 output, according to the invention. If both LFSRs have an initial seed with at least with one '1' (initial random-state), then the random bit output-pattern at the OR-gate 22 output has a weighting of $\frac{1}{2}^2=\frac{1}{4}$. This effect can then be modified to achieve different weights.

Figure 3:
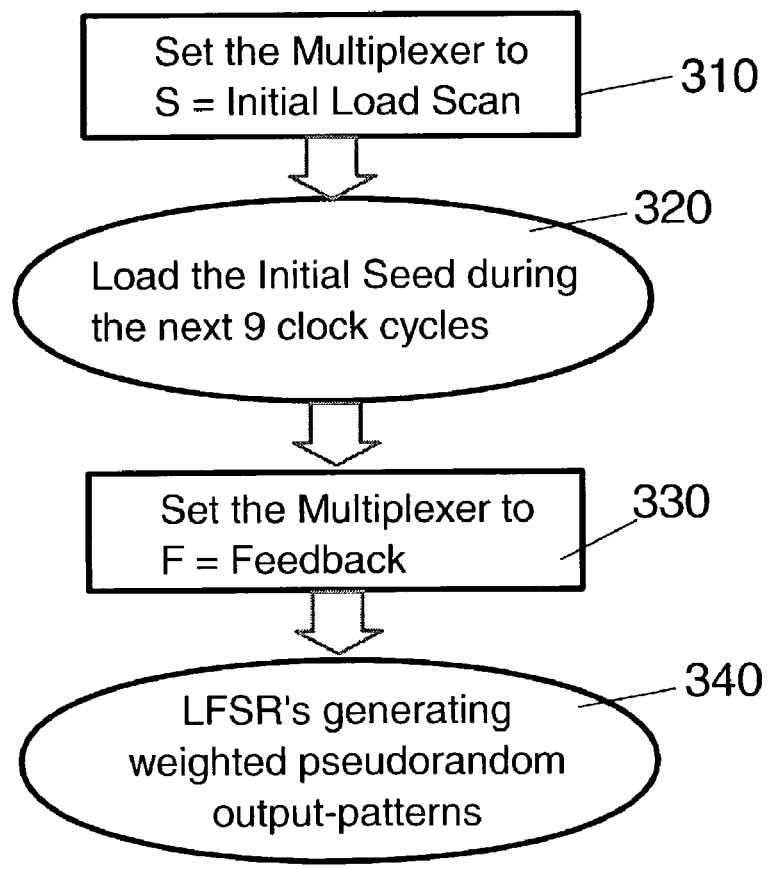
FIG. 3 is a schematic block diagram representation illustrating the basic control flow for the setup of the initial load and the random pattern generation, according to a preferred embodiment of the invention.

In FIG. 3 the initial load procedure and LSFR operation is illustrated. In a first step 310 the switch 20, i.e. a multiplexer is set to S, which corresponds to the initial load scan step, step 310. Then, in a next step 320 the initial seed is loaded during the next 9 clock cycles. Then, in a step 330 the before-mentioned multiplexer is switched to the other position in order to enable the feedback-mode, and finally in phase 340 both LFSRs generate the weighted or flat random output-patterns.

With reference now to FIG. 4 a truth-table is shown with both LFSRs set at least with one "1". In this simple example a 4-bit LFSR is ORed with a 5-bit LSFR, as depicted in FIG. 2. The initial seed is depicted in the first row. Each column reflects a bit-value corresponding to the latches A to I in FIG. 2. The most right-column reflects the bit-value of the output of OR-gate 22. This is the random bit output-pattern the weight of which is controlled by the initial seed, depicted in the first row. Each row represents the bit state one cycle later. As an evaluation of the output column yields, the "0" appears 8 times out of 32 cycles. Thus, a ratio of 8:32 is achieved, which corresponds to a weight of ¼.

With reference now to FIG. 5 the procedure of FIG. 4 is repeated with the limitation, that LFSR-1 has an initial seed of only "0" bits (zero-state). Thus, LFSR-1 produces only "0" bit-values during the operation mode (feedback mode). This is reflected by all rows of LSFR-1 being zero (zero-pattern).

LSFR-2 has the same initial seed as depicted in FIG. 4. As an evaluation of the output bit-value of OR-gate 22 yields, the "0" appears 16 times out of 32 cycles. Thus, a ratio of 16:32 or a weighting of ½ is obtained, according to the inventive control of the initial seed to all bits being zero in LSFR-1.

Figure 6:
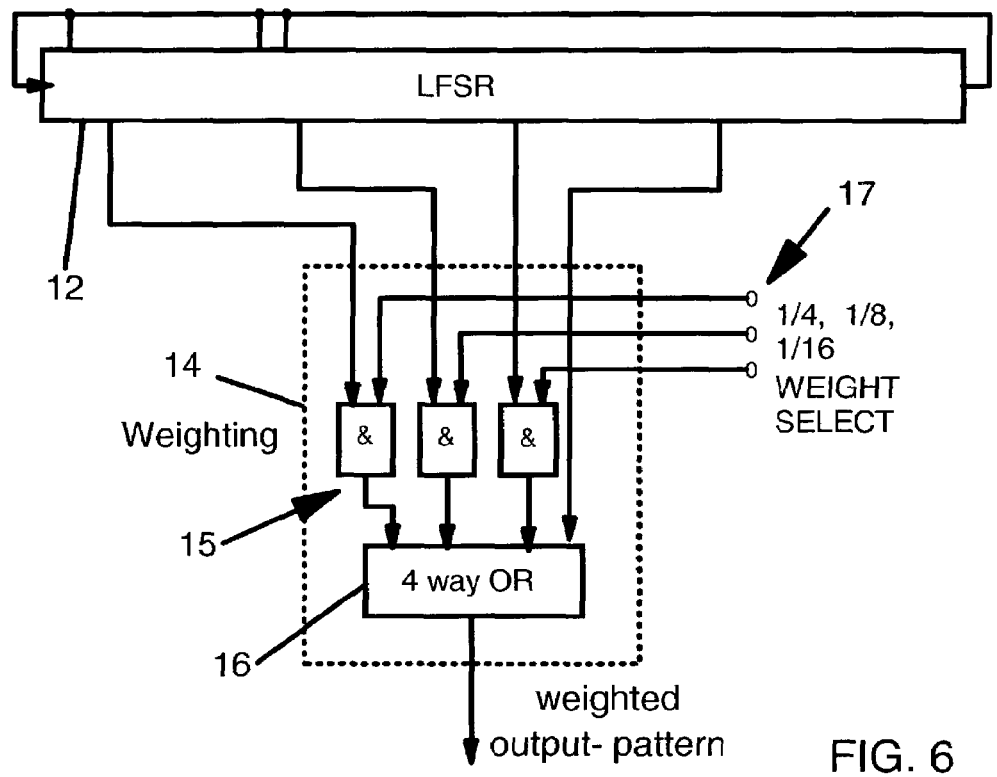
FIG. 6 is a schematic block diagram representation of a sample embodiment of a random weighted pattern generator comprising two LFSRs, according to prior art.
Figure 7:
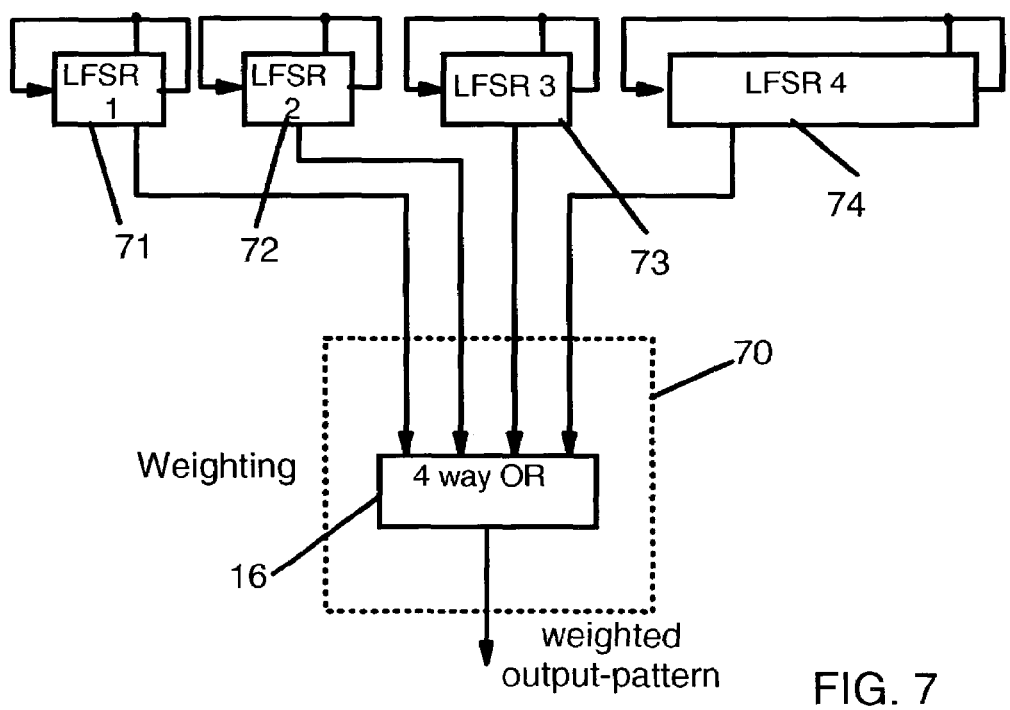
FIG. 7 is a schematic block diagram representation of a sample embodiment of a random weighted pattern generator comprising four LFSRs, according to a sample embodiment of the present invention.

With reference to FIG. 7, a depiction corresponding and improving the prior art depiction of FIG. 6 described earlier above is shown. It comprises four LFSRs 71, 72, 73, 74. Each LFSR is tapped at a predetermined location in order to feed an input into a correspondingly provided 4-way OR-gate, depicted also with reference sign 16. Preferably, the LSFRs 71 to 74 have different lengths and one of it, here the most right one, depicted as LSFR-4 74, is larger than the other ones due to the reasons set out above. All of the LSFRs depicted in the drawing comprise a plurality of latches, which corresponds to a prime number. By that, a long pseudorandom output-pattern period can be obtained. The weighted output-pattern again, can be read from the output of the 4-way OR-gate 16, as depicted in the drawing.

Figure 8:
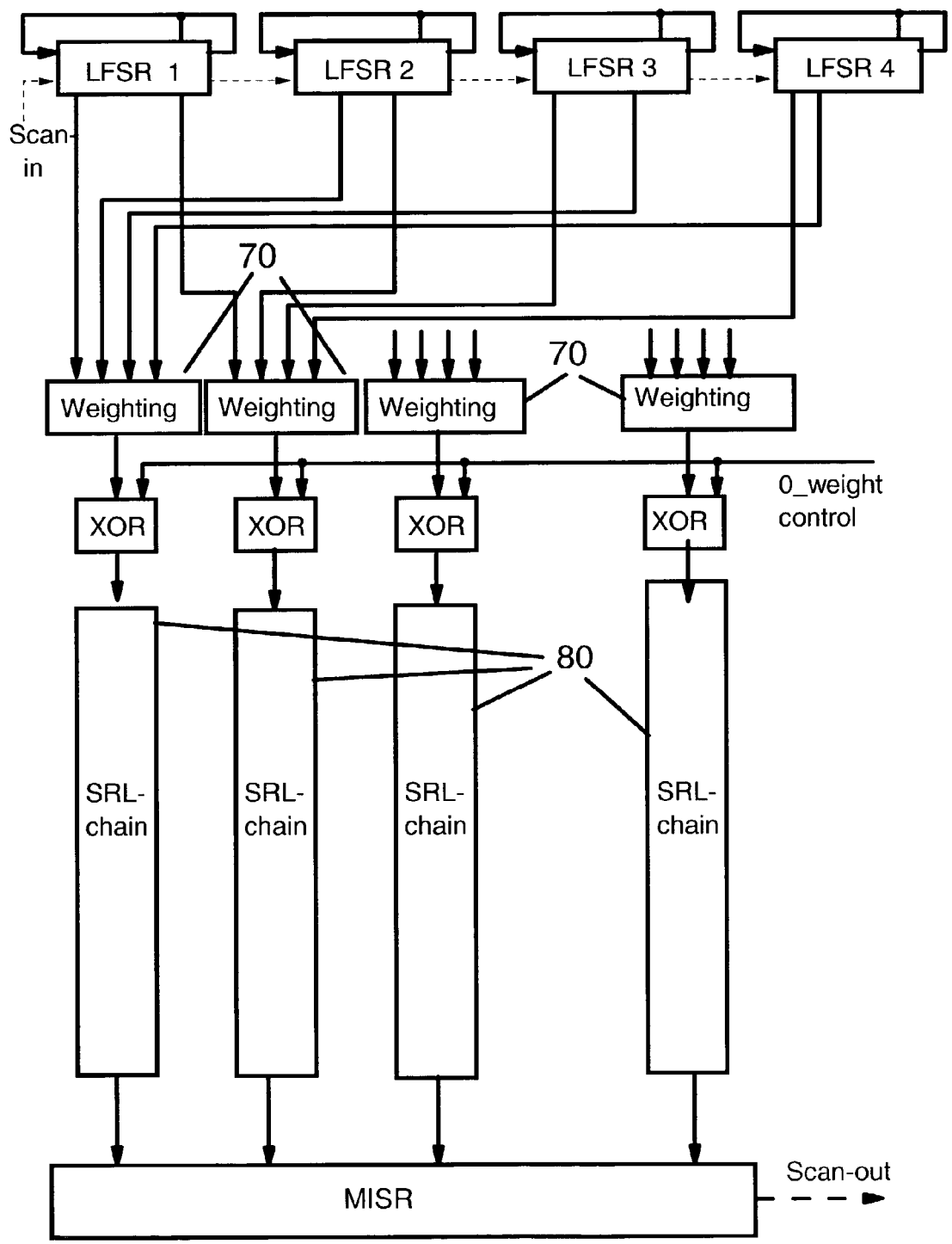
FIG. 8 is a schematic representation of a general block diagram with the weighting logic imbedded into a stumps architecture according to a preferred embodiment of the present invention.

FIG. 8 shows how the weighting logic can be implemented in a prior art stumps architecture, which was mentioned above. In the upper part, the wiring of the two most right weighting circuits 70 is omitted in order to improve the clarity of the drawing.

The upper part corresponds in its basic switching structure that one depicted in FIG. 7.

For each SRL-chain 80 used in prior art for testing a chip, a weighting logic 70 is connected to a respective port of each of the LFSRs. Every weighting logic should preferably be connected to different tap location of the respective LFSR to avoid linear dependencies between the SRL-chains.

In a real BIST (Build in Selftest) chip, LFSRs with many SRLs are used for excluding that the patterns are repeated too early, and for higher ranges of weighting. A realistic generator could have, for example, 4 LFSRs with a length of 7,9,11 and one having 34 Bit. During the initial seed loading, all LFSRs are connected together to one chain and can be loaded like a single LFSR.

In the random pattern-generating mode, each LFSR is running independent from the other LFSRs. The total output-pattern count, that is the calculated upper limit of different pseudorandom output-patterns, depends on the lengths (m) of the LFSRs. More precisely it depends on the loop count (N) of each LFSR, a number that is calculated by the formulae $N = (m^2-1)$. In addition, the LFSR loop counts N1, N2, ... of LFSR1, LFSR2, ... should be different and also should have no common divisor. In other words, the loop counts of each pair of LFSR should not be a multiple of each other's to avoid pattern repetitions through synchronized wrap over. This condition is illustrated by the following example LFSR setup:

EXAMPLE

LFSR Configuration and Calculated Loops Counts

| | | |
|---|---|---|
| LFSR 1 = 7 Bit, | $2^7 - 1 = 127$, | 127 = prime number |
| LFSR 2 = 9 Bit, | $2^9 - 1 = 511$, | 511 = 7 * 73 |
| LFSR 3 = 11 Bit, | $2^{11} - 1 = 2047$, | 2047 = 23 * 89 |
| LFSR 4 = 34 Bit, | $2^{34} - 1 = 17179869183$, | 17179869183 = 3 * 43691 * 131071; |

The total output-pattern count for this sample plurality of LFSRs is calculated as follows:

127*511*2047*17179869183 cycles=2.2822 E18 cycles.

In comparison to a single LFSR with the same number (61) of latches the pattern repeats after $2^{61}-1=2305843009213693951=2.3058$ E18 cycles.

To switch the weighting from mostly '1' to mostly '0', an XOR-gate could be connected behind the OR-gate for building the complement of the output-pattern.

If one or more LFSRs is switched off by zero-state, the total output-pattern count is calculated as follows:

LFSR2, LFSR3 and LFSR4 running:

Total count=511*2047*17179869183=1.79704 E16

LFSR3 and LFSR4 running:

Total count=2047*17179869183=3.51672 E13

LFSR4 running:

Total count=17179869183=1.71799 E10

In summary the total output-pattern count of this example LFSR arrangement is sufficiently high for all common BIST applications.

The present invention can be realized preferably in hardware. A micro code software based solution, or a combination of hardware and such software can also be implemented.

While the preferred embodiment of the invention has been illustrated and described herein, it is to be understood that the invention is not limited to the precise construction herein disclosed, and the right is reserved to all changes and modifications coming within the scope of the invention as defined in the appended claims.

What is claimed is:

1. A method for controlling the weight of a pseudorandom output pattern generated by an electronic circuit, comprising the steps of:

using a plurality of pseudorandom pattern generators (PRPGs) to provide respective sequences of pseudorandom bit-patterns, each of said PRPGs having a predetermined length corresponding to a bit count of an initial state, a predetermined loop count corresponding to a length of a pseudorandom bit-pattern that is repeated indefinitely;

feeding an output from each of said PRPGs to a corresponding input of a common logical OR-gate; and initialising a selected subset of said PRPGs with a random-state, a zero-state or a weight-state in order to generate a weighting pattern comprising a pseudorandom bit-pattern, a zero-pattern or a weight-pattern, respectively, whereby the output of said logical OR-gate provides an output pattern reflecting said weighting pattern.

2. The method according to claim 1 in which said PRPGs comprise linear feedback shift registers, ring shift registers, cellular automata, or other dedicated logic circuits.

3. The method according to claim 1 in which at least two of said PRPGs comprise linear feedback shift registers having predetermined lengths that differ from one another.

4. The method according to claim 1 in which said PRPGs comprise one or more linear feedback shift registers together with one or more ring shift registers, the weight of said pseudorandom output pattern being controlled by the number of linear feedback shift resisters initialised with zero-states for generating zero-patterns and by the number of ring shift registers initialised with weight-states for generating weight-patterns.

5. The method according to claim 1 in which the loop counts of at least two of said PRPGs have no common divisor.

6. An electronic circuit for controlling the weight of a pseudorandom output pattern generated by said circuit, comprising:
   a plurality of pseudorandom pattern generators (PRPGs) for providing respective sequences of pseudorandom bit-patterns, each of said PRPGs having a predetermined length corresponding to a bit count of an initial state, a predetermined loop count corresponding to a length of a pseudorandom bit-pattern that is repeated indefinitely, and an output port for outputting a pseudorandom bit-pattern;
   a common logical OR-gate having inputs for receiving corresponding outputs from said PRPGs; and
   initialisation logic for initialising a selected subset of said PRPGs with a random-state, a zero-state or a weight-state in order to generate a weighting pattern comprising a pseudorandom bit-pattern, a zero-pattern or a weight-pattern, respectively, whereby the output of said logical OR-gate provides an output pattern reflecting said weighting pattern.

7. The electronic circuit according to claim 6 in which said PRPGs comprise linear feedback shift registers, ring shift registers, cellular automata, or other dedicated logic circuits.

8. The electronic circuit according to 6 in which at least two of said PRPGs comprise linear feedback shift registers having predetermined lengths that differ from one another.

9. The electronic circuit according to claim 6 in which said PRPGs comprise one or more linear feedback shift registers together with one or more ring shift registers, the weight of said pseudorandom output pattern being controlled by the number of linear feedback shift registers initialised with zero-states generating zero-patterns and by the number of ring shift registers initialised with weight-states for generating weight-patterns.

10. The electronic circuit according to claim 6 in which the loop counts of at least two of said PRPGs have no common divisor.

11. The electronic circuit according to claim 6 in which said PRPGs comprise linear feedback shift registers.

* * * * *